(12) United States Patent
Tokitoh

(10) Patent No.: US 7,737,474 B2
(45) Date of Patent: Jun. 15, 2010

(54) SEMICONDUCTOR DEVICE WITH SEAL RING HAVING PROTRUDING PORTIONS

(75) Inventor: Shunichi Tokitoh, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 91 days.

(21) Appl. No.: 11/931,234

(22) Filed: Oct. 31, 2007

(65) Prior Publication Data

US 2008/0157285 A1 Jul. 3, 2008

(30) Foreign Application Priority Data

Dec. 27, 2006 (JP) ............................. 2006-352801

(51) Int. Cl.
  *H01L 23/544* (2006.01)
(52) U.S. Cl. ................. 257/211; 257/620; 257/E23.179
(58) Field of Classification Search ................. 257/499, 257/202, 211, 506, 620, E23.179
  See application file for complete search history.

(56) References Cited

U.S. PATENT DOCUMENTS

| | | | |
|---|---|---|---|
| 5,834,829 A | * | 11/1998 | Dinkel et al. ................. 257/620 |
| 6,949,775 B1 | | 9/2005 | Takada |
| 2004/0150070 A1 | * | 8/2004 | Okada et al. ................. 257/508 |
| 2005/0087878 A1 | | 4/2005 | Uesugi et al. |
| 2005/0093169 A1 | * | 5/2005 | Kajita ......................... 257/774 |
| 2005/0098893 A1 | | 5/2005 | Tsutsue et al. |
| 2006/0076651 A1 | | 4/2006 | Tsutsue |
| 2006/0103025 A1 | | 5/2006 | Furusawa et al. |
| 2007/0018331 A1 | * | 1/2007 | Chen ........................... 257/774 |

FOREIGN PATENT DOCUMENTS

| | | |
|---|---|---|
| JP | 2000269219 | 9/2000 |
| JP | 2004297022 | 10/2004 |
| JP | 2005129717 | 5/2005 |
| JP | 2005167198 | 6/2005 |
| JP | 2006093407 | 4/2006 |
| JP | 2006140404 | 6/2006 |

* cited by examiner

*Primary Examiner*—Minh-Loan T Tran
(74) *Attorney, Agent, or Firm*—Volentine & Whitt, P.L.L.C.

(57) ABSTRACT

A semiconductor device includes a substrate, on which an element region and a peripheral region are defined. At least one function element is to be provided in the element region, and the peripheral region surrounds the element region. The semiconductor device also includes a layer of wiring. The semiconductor device also includes a seal ring having a ring portion that is provided in the peripheral region in the same layer as the wiring layer. The ring portion has a main body surrounding a chip region, and a plurality of portions protruding toward the element region from the seal ring main body.

18 Claims, 8 Drawing Sheets

FIG. 4A
FIG. 4B
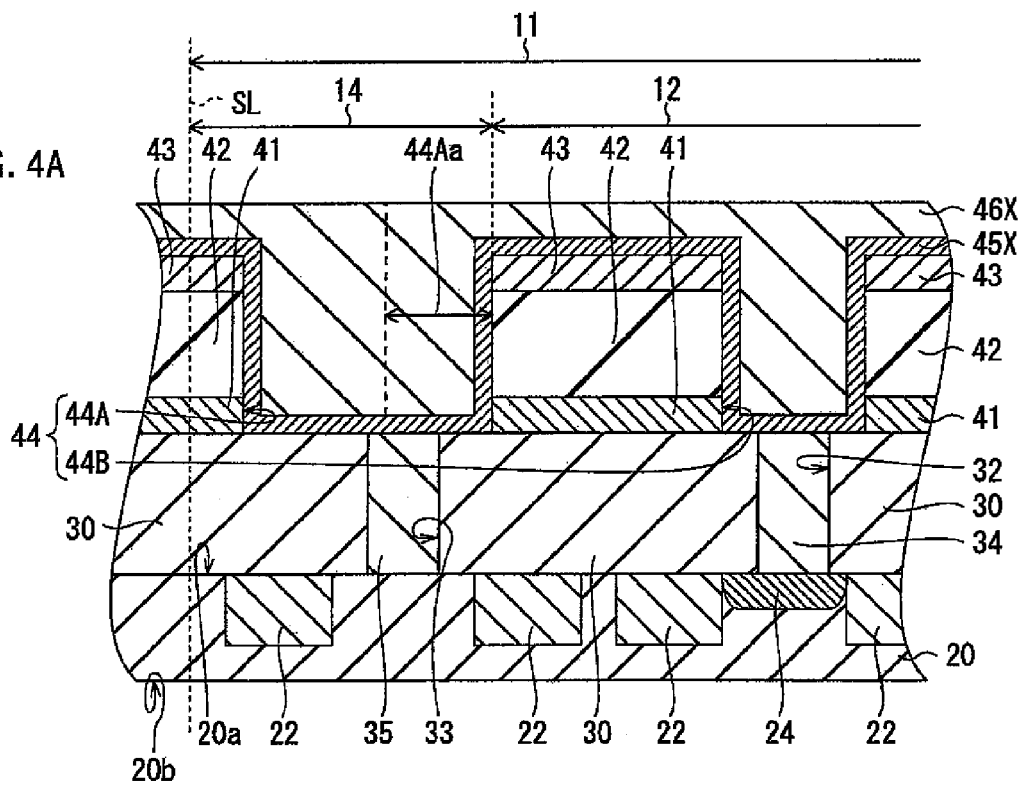
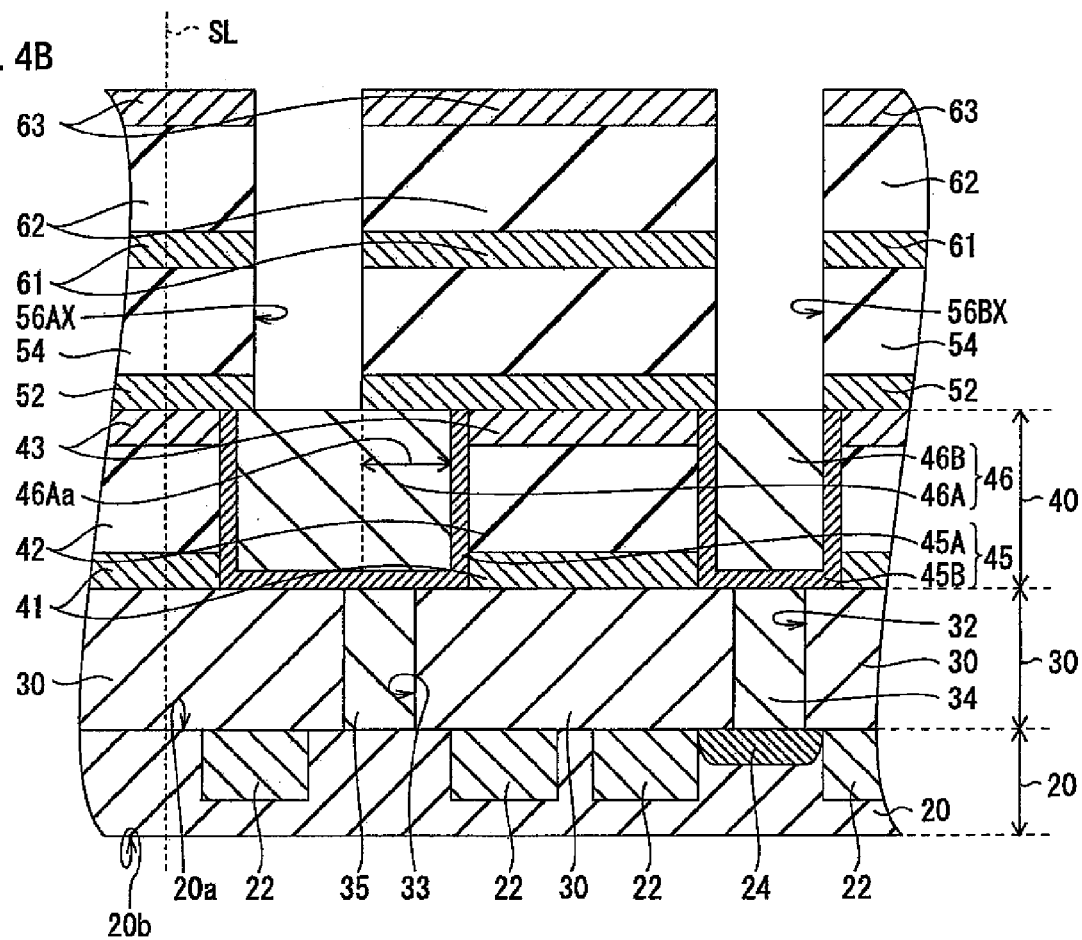

SEMICONDUCTOR DEVICE WITH SEAL RING HAVING PROTRUDING PORTIONS

BACKGROUND OF THE INVENTION

1. Field of the Invention

The present invention relates to a semiconductor device and a manufacturing method thereof, and more particularly to a semiconductor device having a seal ring and a manufacturing method thereof.

2. Description of the Related Art

With recent improvements in the integration and performance of elements in semiconductor devices, demand has grown for further reductions in wiring thickness and wiring intervals. As miniaturization of the manufacturing process advances, wiring delays limit the operation speed. To deal with this problem, copper wire technology, in which low-resistance copper (Cu) or a copper alloy is used as wiring material, was proposed. It is difficult to process copper or a copper alloy by etching technology when the copper or alloy is used as wiring material. Therefore, a manufacturing method known as a Damascene method is typically employed.

In the Damascene method, a wiring trench is formed in an insulating film, a copper alloy thin film is deposited in the wiring trench, and then the copper alloy thin film is ground from the upper side thereof to leave only the part embedded in the wiring trench remaining. Thus, an embedded wire is formed. In the process for grinding the copper alloy thin film, a CMP (Chemical Mechanical Polishing) method is used.

To reduce the capacitance of the wiring when employing this type of copper wiring technology, a so-called low dielectric constant film is used as an insulating film instead of a conventional silicon oxide film. The low dielectric constant film has a dielectric constant (k) between approximately 4.2 and approximately 1.5.

This type of low dielectric constant film, particularly a porous film, has a low interface adhesion property as a mechanical characteristic (Modulus, Hardness). Therefore, during processes of the Damascene method in which stress is applied to the low dielectric constant film, such as the CMP process and a segmentation process, damage such as peeling may occur on the interface between the low dielectric constant film and an insulating film or another structure such as a seal ring that contacts the low dielectric constant film. As a result, the electric characteristic of the semiconductor device may be damaged.

Among semiconductor devices employing the Damascene method and a low dielectric constant film, a semiconductor device provided with a so-called seal ring that continuously surrounds an element region with the aim of preventing damage inflicted during dicing from reaching the element region is known, and a manufacturing method of such semiconductor device is also known (for example, Japanese Patent Application Kokai No. 2005-167198).

This conventional seal ring is capable of preventing cracks (peeling) that occur outside the element region during the segmentation process from spreading to the element region.

SUMMARY OF THE INVENTION

However, peeling on the interface between the low dielectric constant film and the seal ring in contact therewith is sometimes caused by the seal ring itself.

The conventional seal ring cannot prevent peeling or cracks occurring on the element region side interface of the seal ring. The conventional seal ring cannot prevent propagation of the cracks to the element region.

Hence, an improved structure is needed for preventing the occurrence of cracks on the element region side interface of the seal ring and propagation of the cracks to the element region when great stress is applied to the interface between the low dielectric constant film and the seal ring during a CMP process, for example.

The present invention has been designed in consideration of the above-described problems.

According to one aspect of the present invention, there is provided a semiconductor device that includes a substrate, on which an element region and a peripheral region are defined. One or more function elements are to be provided in the element region. The peripheral region surrounds the element region. The semiconductor device also includes a first wiring layer which has wiring provided in the element region. The semiconductor device also includes a first seal ring having a ring portion that is provided in the peripheral region in the same layer as the first wiring layer. The ring portion has an main body extending around the element region. The ring portion also has a plurality of portions protruding toward the element region from the seal ring main body.

One of the features of the semiconductor device of the present invention lies in that the seal ring has a plurality of protruding portions extending toward the element region. Because of this structure of the seal ring, the contact area between the seal ring and the insulating film is increased greatly. Hence, stress generated in the CMP process, for example, is dispersed over the increased contact area. As a result, peeling on the interface between the low dielectric constant film and other structures can be prevented effectively.

The protruding portions of the seal ring may take arbitrary preferred shapes within the allowable range of the so-called technology node, but preferably have an identical shape and an identical size. The protruding portions of the seal ring may be arranged in parallel to the extending direction of the seal ring. The seal ring protruding portions may be spaced from each other at equal intervals.

Preferably, the minimum interval between adjacent protruding portions is no smaller than a minimum interval decided by the resolution limit of an optical system in an employed exposure device.

Preferably, the protruding portions all take a rectangular shape, when viewed from top. Preferably, a short side or a long side of the rectangular shape extends in a perpendicular direction to the extending direction of the seal ring. Preferably, the rectangular shape has a minimum size that is decided by the resolution limit of the optical system in the employed exposure device.

According to another aspect of the present invention, there is provided a method of manufacturing a semiconductor device. The semiconductor device has a multi-layer wiring structure in which a plurality of wiring layers are laminated. Each two wiring layers are separated from each other by an interlayer insulating film. The manufacturing method includes the step of preparing a substrate, on which an element region and a peripheral region surrounding the element region are defined. The manufacturing method also includes the step of forming a first insulating film on the substrate. The manufacturing method also includes the step of forming a plurality of wiring layers stacked on the first insulating film. The manufacturing method also includes the step of forming a plurality of ring portions in the wiring layers respectively.

Each ring portion has a main body surrounding the element region. Each ring portion also has a plurality of portions protruding toward the element region from the seal ring main body in the peripheral region and in the same layer as the wiring layer concerned. The manufacturing method also includes the step of forming a plurality of embedded portions that penetrate the interlayer insulating films and the first insulating film, respectively, so as to connect the ring portions to each other without gaps by the embedded portions.

This manufacturing process can fabricate the above-described semiconductor device of the present invention in an efficient manner.

According to still another aspect of the present invention, there is provided a manufacturing method for a semiconductor device having a multi-layer wiring structure in which a plurality of wiring layers are laminated such that each two wiring layers are separated from each other by an interlayer insulating film. This manufacturing method comprises: preparing a substrate on which an element region and a peripheral region surrounding the element region are defined; forming a first insulating film on the substrate; forming a plurality of wiring layers stacked on the first insulating film such that each two wiring layers are separated from each other by an interlayer insulating film; forming a plurality of ring portions in the wiring layers, respectively, each ring portion having a main body surrounding the element region and a plurality of protruding portions protruding toward the element region from the seal ring main body in the peripheral region and in the same layer as the wiring layer concerned; and forming a plurality of embedded portions that penetrate the interlayer insulating films and the first insulating film, respectively, so as to connect the ring portions to each other without gaps by the embedded portions.

Each ring portion and the embedded portion extending below the ring portion concerned may be formed simultaneously and integrally.

All of the protruding portions may have an identical shape and an identical size, the protruding portions may be arranged in parallel to an extending direction of the seal ring main body, and the protruding portions may be spaced from each other at equal intervals.

The interval between the protruding portions may be no smaller than a minimum interval defined by a resolution limit of an optical system in an employed exposure device.

Each protruding portion may take a rectangular shape, when viewed from top, a short side or a long side of the rectangular shape may extend in a perpendicular direction to the extending direction of the seal ring main body, and a minimum size of the rectangular shape may be decided by a resolution limit of an optical system in an employed exposure device.

According to yet another aspect of the present invention, there is provided a method of manufacturing a semiconductor device comprising: preparing a substrate, on which an element region and a peripheral region surrounding the element region are defined; forming a plurality of function elements and an element separation structure for electrically separating the function elements from each other on the substrate; forming a first insulating film on the substrate so as to cover the function elements and the element separation structure; forming a contact hole in the element region so as to penetrate the first insulating film, and forming a seal ring-specific first trench in the peripheral region so as to penetrate the first insulating film; forming an embedded contact in the contact hole, and forming a seal ring-specific first embedded portion that is embedded in the seal ring-specific first trench and has an embedded portion main body and a protruding portion protruding toward the element region; successively laminating a first diffusion preventing film so as to cover the first insulating film, a second insulating film so as to cover the first diffusion preventing film, and a first cap film so as to cover the second insulating film; forming a first trench portion that has a wiring-specific first trench and a seal ring-specific second trench, the wiring-specific first trench penetrating the first diffusion preventing film, the second insulating film and the first cap film so as to expose an apex of the embedded contact, and the seal ring-specific second trench surrounding the element region so as to expose an apex of the seal ring-specific first embedded portion and having a plurality of first protruding regions protruding toward the element region within the peripheral region; forming a first barrier metal film covering a surface of the first cap film and a surface of the first trench portion; depositing a first wiring film so as to be embedded in the first trench portion and cover the first barrier metal film; grinding the first wiring film and the first barrier metal film until the surface of the first cap film is exposed from a surface of the first wiring film to form a second embedded portion including a wiring-specific first embedded portion embedded in the wiring-specific first trench and a seal ring-specific second embedded portion embedded in the seal ring-specific second trench, the seal ring-specific second embedded portion having a main body and a protruding portion protruding toward the element region; successively laminating a second diffusion preventing film so as to cover the exposed first cap film, wiring-specific first barrier metal, seal ring-specific first barrier metal, wiring-specific first embedded portion, and seal ring-specific second embedded portion, a third insulating film so as to cover the second diffusion preventing film, a third diffusion preventing film so as to cover the third insulating film, a fourth insulating film so as to cover the third diffusion preventing film, and a second cap film so as to cover the fourth insulating film; penetrating the second cap film, the fourth insulating film, the third diffusion preventing film, the third insulating film, and the second diffusion preventing film to form a wiring-specific precursory second trench that exposes a part of an apex of the first embedded portion, and a seal ring-specific precursory third trench that surrounds the element region; completing a second trench portion including a wiring-specific second trench and a seal ring-specific third trench, the wiring-specific second trench being obtained by forming, in a region including the wiring-specific precursory second trench, a wider upper trench that is wider than the wiring-specific precursory second trench and penetrates from the second cap film to the third diffusion preventing film so as to communicate with a lower trench, and the seal ring-specific third trench being obtained by forming, in a region including the seal ring-specific precursory third trench, a wider upper trench that is wider than the seal ring-specific precursory third trench, has a plurality of second protruding regions protruding toward the element region, and penetrates from the second cap film to the third diffusion preventing film so as to communicate with a lower trench; forming a second barrier metal film so as to cover a surface of the second cap film and a surface of the second trench portion; depositing a second wiring film so as to be embedded in the second trench portion and cover the second barrier metal film; and grinding the second wiring film and the second barrier metal film until the surface of the second cap film is exposed from a surface of the second wiring film to form a third embedded portion including a wiring-specific second embedded portion embedded in the wiring-specific second trench and a seal ring-specific third embedded portion embedded in the seal ring-specific third trench.

BRIEF DESCRIPTION OF THE DRAWINGS

FIGS. 4A and 4B are cross-sectional views of a semiconductor device during manufacture, taken along the line 2-2 in FIG. 1B;

DETAILED DESCRIPTION OF THE INVENTION

Figure 1A:
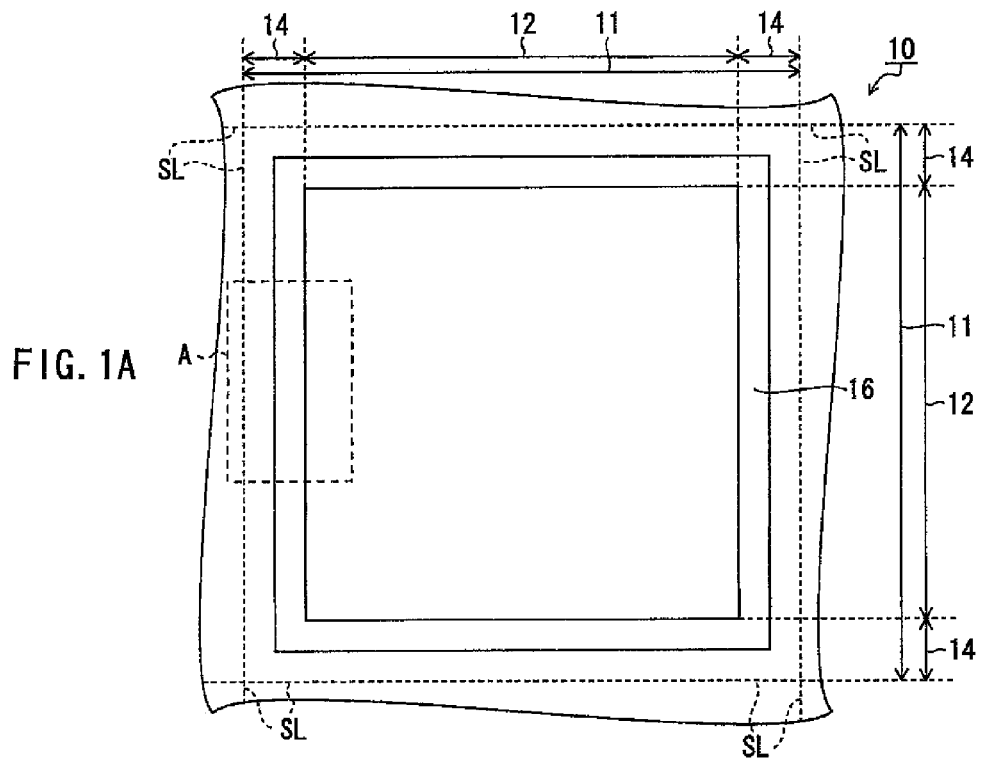
FIG. 1A is a partial plan view of a single semiconductor device immediately before segmentation.

Embodiments of the present invention will now be described below with reference to the accompanying drawings. It should be noted that in the drawings, the shape, size, and positional relationships of constitutional components are illustrated schematically to an extent at which the present invention can be understood. Accordingly, the present invention should not be limited to the illustrated examples.

In the following description, specific materials, conditions, numerical values, and so on are explicitly mentioned, but these are merely preferred examples, and the present invention should not be limited to these preferred examples.

Also, in the different drawings, identical reference symbols and numerals are allocated to similar constitutional components, and duplicate description thereof is occasionally omitted.

First Embodiment

Referring to FIGS. 1A, 1B, 2 and 3, a structure of a semiconductor device 10 according to the first embodiment will be described in detail.

FIG. 1A illustrates a single semiconductor device 10 immediately before segmentation, seen from an upper surface side. It should be noted that some components of lower wiring layers of the semiconductor device 10 are given reference symbols and numerals in FIGS. 1A and 1B although these components are only seen in fact in FIG. 2.

The semiconductor device 10 has a substrate 20, and a seal ring 16 provided on the substrate 20 so as to surround an element region (active region) 12. One feature of the semiconductor device 10 is the shape of the seal ring 16.

These points will now be described in sequence.

Figure 2:
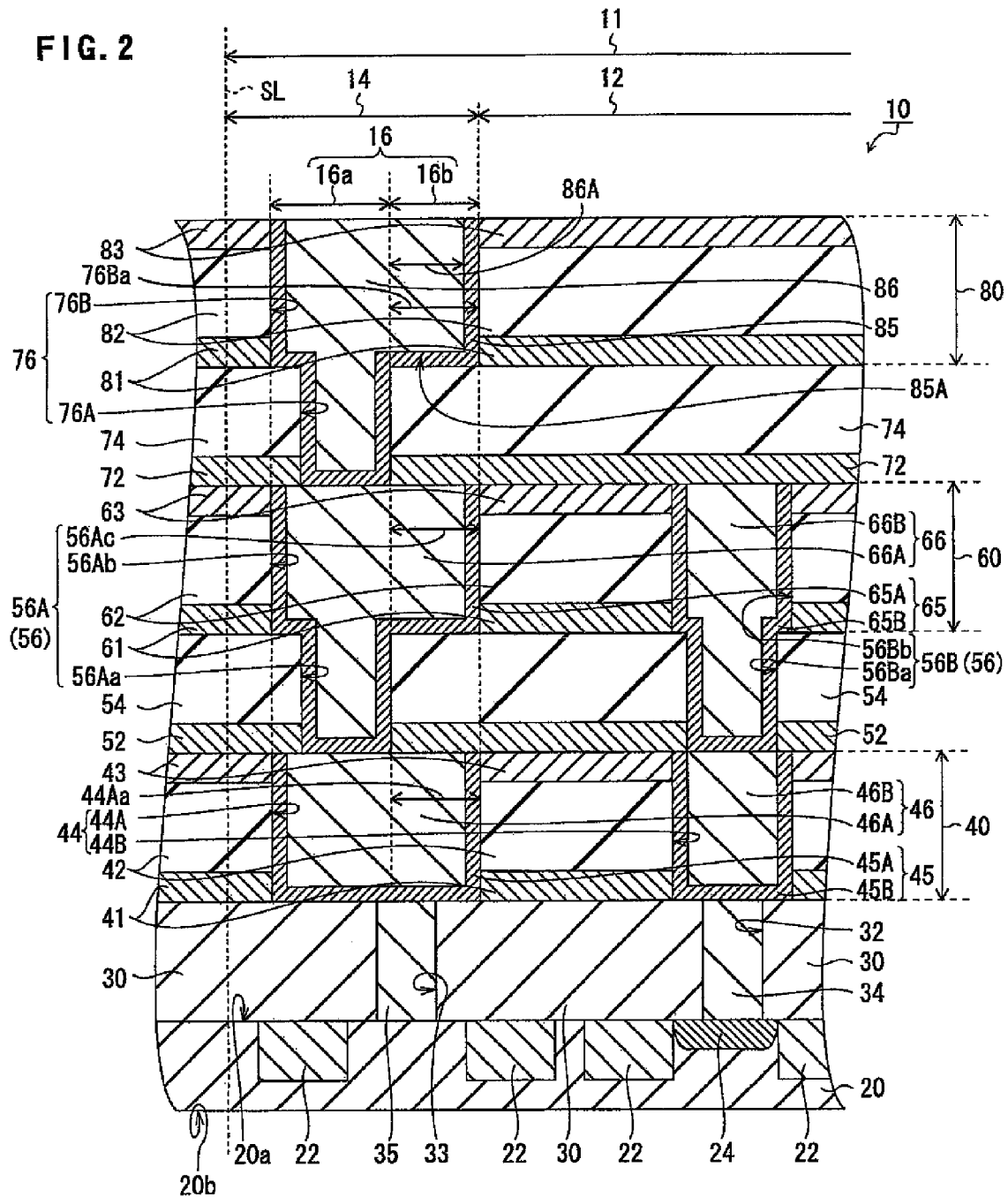
FIG. 2 is a partial enlarged view of a cross-section taken along the dot-dash line 2-2 in FIG. 1B.

First, as shown in FIG. 2, the semiconductor device 10 includes the substrate 20. The substrate 20 is preferably a semiconductor substrate such as a silicon wafer.

The substrate 20 has an upper surface 20a and a lower surface 20b. The upper surface 20a is generally parallel to the lower surface 20b. A chip region 11 that forms the semiconductor device 10 upon segmentation is defined on the substrate 20. In the illustrated example, scribe lines SL that will be ground during the segmentation process serve as the boundaries of the chip region 11.

As shown in FIG. 1A, a rectangular element region 12 and a peripheral region 14 surrounding the element region 12 are defined on the substrate 20. In the element region 12, there are provided functional elements such as a transistor.

A plurality of wiring layers, namely, a first wiring layer 40, a second wiring layer 60, and a third wiring layer 80, are provided on the substrate 20. Also, a plurality of interlayer insulating films for separating these wiring layers from each other, namely, first through sixth insulating films 30, 42, 54, 62, 74 and 82, are provided on the substrate 20.

More specifically, the first insulating film 30, first wiring layer 40, third insulating film 54, second wiring layer 60, fifth insulating film 74, and third wiring layer 80 are successively laminated onto the substrate 20 in a hierarchical manner. The second insulating film 42 is included in the tier of the first wiring layer 40, the fourth insulating film 62 is included in the tier of the second wiring layer 60, and the sixth insulating film 82 is included in the tier of the third wiring layer 80.

Figure 1B:
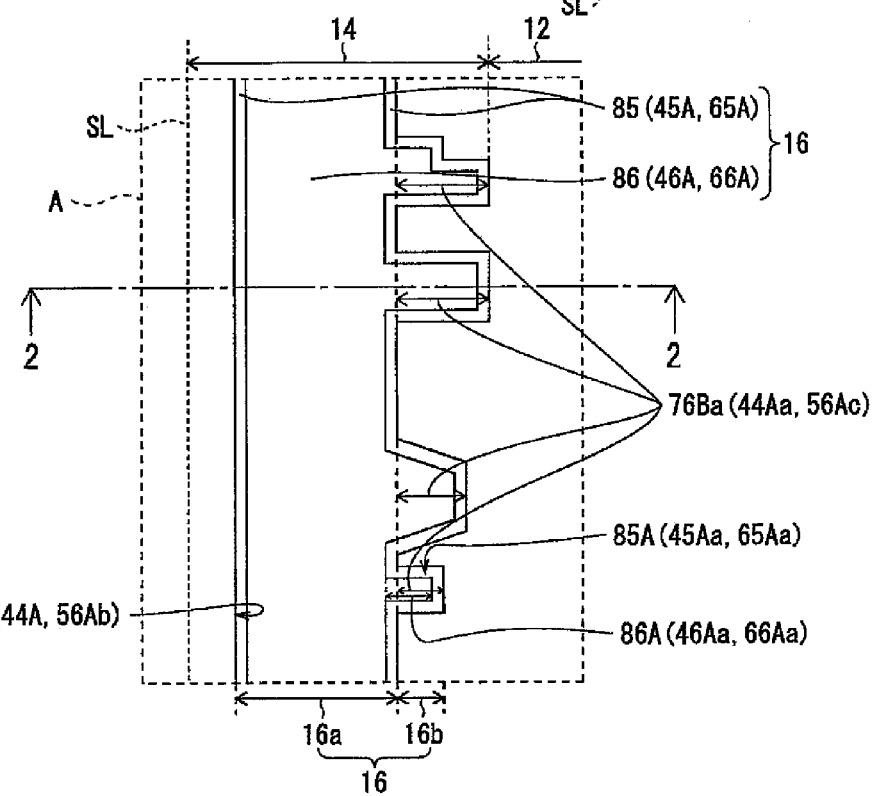
FIG. 1B is an enlarged view of a region A shown in FIG. 1A.

As shown in FIGS. 1A and 1B, the seal ring 16 is provided in the peripheral region 14 surrounding the element region 12, and has a main body 16a that surrounds the element region 12. In other words, the seal ring main body 16a takes the closed shape. In this example, the contour of the seal ring main body 16a is preferably a square shape, so as to correspond to the shape of the element region 12. The shape of the seal ring main body 16a can be an arbitrary preferred shape corresponding to the shape of the element region 12 or the chip region 11. The periphery of the element region 12 is surrounded by the seal ring 16, which is formed in an integral wall shape, without gaps.

As shown in FIG. 1B, the seal ring 16 further includes a plurality of protruding portions 16b formed integrally with the seal ring main body 16a. The protruding portions 16b protrude from the seal ring main body 16a toward the element region 12. In the illustrated example, the shape of the protruding portions 16b, when viewed from the top, may be have an arbitrary size and an arbitrary shape within the allowable range of a manufacturing method to be described below (e.g., a photolithography process). In FIG. 1B, the protruding portions 16b are formed in a combination of a plurality of different shapes including an irregular square shape from which one corner area is cut away (or a short "L" shape), a rectangular shape, a trapezoid shape, and a smaller rectangular shape. The spacing or intervals between these protruding portions 16b may also be set arbitrarily within the allowable range of the manufacturing method (e.g., photolithography process).

The seal ring main body 16a and protruding portions 16b are provided in the peripheral region 14 and penetrate the wiring layers 40, 60, 80. Hereafter, the seal ring main body 16a and protruding portions 16b will be referred to together as a ring portion.

In FIG. 2, the seal ring 16 has an embedded portion and a barrier metal provided on a wall surface excluding the apex of the embedded portion. To describe this in further detail with reference to FIGS. 2 and 3, a seal ring-specific first embedded portion 35 is provided so as to penetrate the first insulating film 30. A seal ring-specific second embedded portion 46A having a first barrier metal 45A is provided as a first ring portion 48 penetrating the second insulating film 42. A seal ring-specific third embedded portion 66A having a second barrier metal 65A is provided as a second ring portion 68 penetrating the third insulating film 54 and fourth insulating film 62. A fourth embedded portion 86 having a third barrier metal 85 is provided as a third ring portion 88 penetrating the fifth insulating film 74 and sixth insulating film 82.

Thus, a required region of the substrate 20 and the embedded portion 86 of the third wiring layer 80 are joined continuously by the embedded portions 35, 46A, 66A and barrier metals 45A, 65A, 85 provided therebetween.

Hence, the main body 16a of the ring portion is provided in a closed shape. More specifically, the seal ring 16 is constituted by closed-shaped embedded portions that penetrate the insulating films separating the ring portions from each other and from the substrate so as to connect the ring portions and the substrate to each other. As a result, the periphery of the element region 12 is surrounded by the seal ring 16, which is formed in an integral wall shape, without gaps.

The seal ring 16 will be described in further detail. In the following description, it is assumed that the protruding portions 16b of the first, second and third ring portions 48, 68, 88 provided in the respective wiring layers 40, 60, 80 are all shaped identically. It should be noted, however, that the semiconductor device according to the present invention is not limited to such identically shaped protruding portions 16b. Ring portions having main bodies 16a and protruding portions 16b with different shapes and/or sizes may be provided in the wiring layers.

A plurality of function elements, for example transistors constituted by diffusion layers 24, although the details thereof are omitted here, are provided on the upper surface 20a of the substrate 20. Element separation structures 22 for electrically separating the function elements, such as STI (Shallow Trench Isolation) or LOCOS (Local Oxidation of Silicon), are also provided on the substrate 20.

The first insulating film 30 is provided on the upper surface 20a of the substrate 20. It can be said that the first insulating film 30 is provided on the diffusion layers 24 and the element separation structures 22.

The first insulating film 30 is a silicon oxide film, for example.

A contact hole 32 penetrating the first insulating film 30 up to the diffusion layer 24 in this example is provided within the element region 12 of the first insulating film 30.

A seal ring-specific first trench 33 penetrating the first insulating film 30 up to the substrate upper surface 20a is provided within the peripheral region 14 of the first insulating film 30.

The seal ring-specific first trench 33 surrounds the element region 12 in a closed shape.

A contact 34 is embedded in the contact hole 32. The embedded contact 34 may be made from a known conductive material such as tungsten (W).

Similarly, a known conductive material such as tungsten may be embedded in the first trench 33 to form the seal ring-specific first embedded portion 35. The embedded contact 34 and the first embedded portion 35 are preferably formed from the same material.

It should be noted that when the first insulating film 30 is formed from a silicon oxide film, the first embedded portion 35 does not need to be formed in a continuous shape surrounding the element region 12 with no gaps, and may be formed in a plurality of rod shapes similar to the embedded contact 34. In this case, the rod-shaped bodies of the first embedded portion 35 are disposed around the element region 12.

A first diffusion preventing film 41 is provided on the first insulating film 30 and the embedded contact 34 and first embedded portion 35 exposed from the first insulating film 30. The first diffusion preventing film 41 prevents diffusion of the copper used as the material for the wiring in particular.

The first diffusion preventing film 41 may be a silicon nitride film or a silicon carbide (SiC) film.

The second insulating film 42 is laminated onto the first diffusion preventing film 41.

The second insulating film 42 is preferably a low dielectric constant film having a smaller dielectric constant than a silicon oxide film. More specifically, the film is preferably a known low dielectric constant film (Low-k film) having a maximum specific dielectric constant (k) of 3.0 and made of a material such as HSQ (hydrogen silsesquioxane), MSQ (methyl silsesquioxane), or CDO (carbon doped oxide), or a polymer material such as SiLK (registered trademark), manufactured by The Dow Chemical Company.

The film thickness of the second insulating film 42 is preferably within a range of 100 nm to 5000 nm.

A first cap film 43 is provided on the surface of the second insulating film 42. The cap film is a film that protects a low dielectric constant film formed from high-density silicon oxide, for example.

A first trench portion 44 is provided so as to penetrate the first cap film 43, second insulating film 42, and first diffusion preventing film 41 from the surface of the first cap film 43 to the surface of the first insulating film 30.

The first trench portion 44 is formed to expose the top surfaces of the embedded contact 34 and the first embedded portion 35.

The first trench portion 44 includes a wiring-specific first trench 44B and a seal ring-specific second trench 44A. The wiring-specific first trench 44B is provided directly above the embedded contact 34 in the element region 12 so as to expose the top surface of the embedded contact 34. The seal ring-specific second trench 44A is provided directly above the seal ring-specific first embedded portion 35 in the peripheral region 14 so as to expose the top surface of the first embedded portion 35.

As shown in FIG. 1B, the seal ring-specific second trench 44A has a first protruding region 44Aa defining the outline of the main body 16a and the protruding portion 16b.

A first barrier metal 45 is provided on the inner surface of the first trench portion 44. More specifically, a seal ring-specific first barrier metal 45A is provided on the inner surface of the seal ring-specific second trench 44A including the top surface of the seal ring-specific first embedded portion 35, and a wiring-specific first barrier metal 45B is provided on the inner surface of the wiring-specific first trench 44B including the top surface of the embedded contact 34.

The seal ring-specific first barrier metal 45A has a bent portion 45Aa having a meandering shape that follows the outline of the first protruding region 44Aa of the seal ring-specific second trench 44A.

The first barrier metal 45 is a single layer film or a multi-layer film made from a material selected from a group including tantalum, tantalum nitride, tungsten, tungsten nitride, WSiN, titanium nitride, and TiSiN, for example.

The film thickness of the first barrier metal 45 is preferably within a range of 2 nm to 50 nm. In practice, the film thickness of the first barrier metal 45 has an optimum value decided by the so-called technology node.

A second embedded portion 46 made of copper or a copper alloy, for example, is provided on the first barrier metal 45. It can be said that the second embedded portion 46 is embedded in the first trench portion 44 covered with the first barrier metal 45.

The second embedded portion 46 is one of the essential elements of the first wiring layer 40. The second embedded portion 46 includes a wiring-specific first embedded portion 46B and a seal ring-specific second embedded portion 46A. The wiring-specific first embedded portion 46B constitutes a plurality of wires included in the first wiring layer 40.

The wiring-specific first embedded portion 46B is embedded in the wiring-specific first trench 44B. The seal ring-specific second embedded portion 46A is embedded in the seal ring-specific second trench 44A.

The top surfaces of the wiring-specific first embedded portion 46B and seal ring-specific second embedded portion 46A have a substantially identical height to the surface of the first cap film 43.

Figure 3:
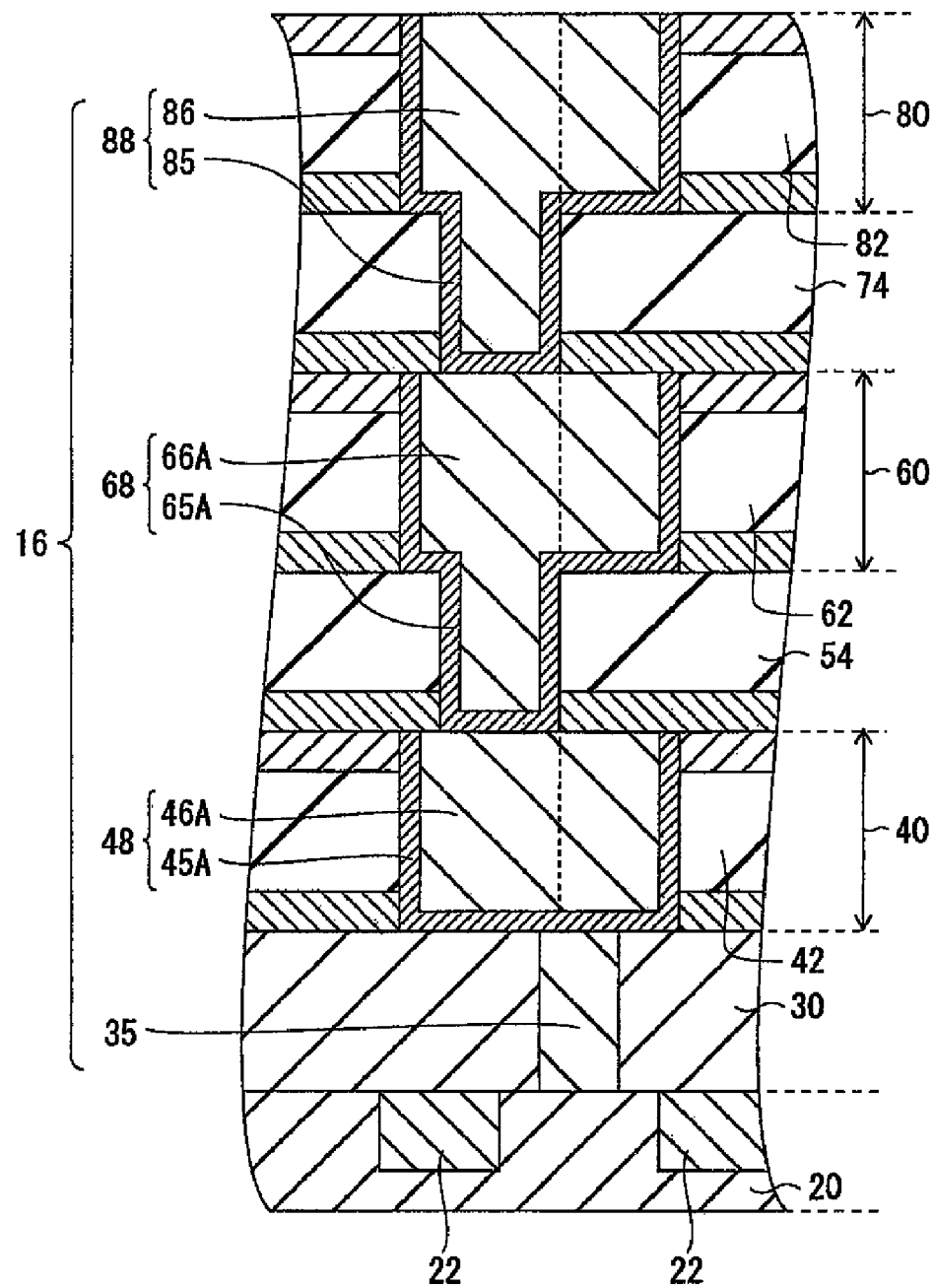
FIG. 3 is similar to FIG. 2, focusing in particular on a seal ring.

As shown in FIG. 3, the first ring portion 48 is constituted by the seal ring-specific second embedded portion 46A and the seal ring-specific first barrier metal 45A.

A second diffusion preventing film 52 having a similar constitution to the first diffusion preventing film 41 is provided on the first cap film 43, first barrier metal 45, and embedded portion 46.

A third insulating film 54 is laminated onto the second diffusion preventing film 52. The third insulating film 54 is a low dielectric constant film which is similar to the second insulating film 42.

A third diffusion preventing film 61 having a similar constitution to the first diffusion preventing film 41 is provided on the third insulating film 54.

The fourth insulating film 62 is laminated onto the third diffusion preventing film 61. The fourth Insulating film 62 is a similar low dielectric constant film to the second insulating film 42.

A second cap film 63 having a similar constitution to the first cap film 43 is provided on the fourth insulating film 62.

A second trench portion 56 is provided so as to penetrate the second diffusion preventing film 52, third insulating film 54, third diffusion preventing film 61, fourth insulating film 62, and second cap film 63.

The second trench portion 56 includes a seal ring-specific third trench 56A provided in the peripheral region 14, and a wiring-specific second trench 56B provided in the element region 12.

The second trench portion 56 is formed in consideration of the Damascene method that is employed in the formation process of each wiring layer of the semiconductor device 10. In this embodiment, a so-called dual Damascene method is used, in which an embedded via connected to a lower wiring layer is embedded simultaneously with the formation of an upper wiring layer.

A seal ring-specific lower trench 56Aa extending to a part of the apex of the seal ring-specific second embedded portion 46A and a wiring-specific lower via hole 56Ba extending to a part of the apex of the wiring-specific first embedded portion 46B are provided so as to penetrate the second diffusion preventing film 52 and third insulating film 54. The seal ring-specific lower trench 56Aa is provided in the peripheral region 14. The wiring-specific lower via hole 56Ba is provided in the element region 12.

A seal ring-specific upper trench 56Ab having a greater width than the lower trench 56Aa and a wiring-specific upper trench 56Bb having a greater width than the diameter of the lower via hole 56Ba are provided so as to penetrate the third diffusion preventing film 61, fourth insulating film 62, and second cap film 63. The seal ring-specific upper trench 56Ab is provided in the peripheral region 14. The wiring-specific upper trench 56Bb is provided in the element region 12.

More specifically, the seal ring-specific third trench 56A is formed by the upper trench 56Aa and lower trench 56Ab, which have the same shape except for the trench width, and the lower and upper trenches 56Aa and 56Ab communicate vertically. Likewise, the wiring-specific second trench 56B is formed by the lower via hole 56Ba and the upper trench 56Bb that communicate with each other.

Thus, the seal ring-specific third trench 56A and the wiring-specific second trench 563 have a two-tier structure having two trenches or a combination of a trench and a via hole.

As shown in FIG. 1B, the seal ring-specific third trench 56A has a second protruding region 56Ac defining the outline (contour) of the main body 16a and the protruding portion 16b.

A second barrier metal 65 having a similar constitution to the first barrier metal 45 is provided on the inner surface of the second trench portion 56. More specifically, a seal ring-specific second barrier metal 65A is provided on the inner surface of the seal ring-specific third trench 56A including a part of the apex of the seal ring-specific second embedded portion 46A, and a wiring-specific second barrier metal 65B is provided on the inner surface of the wiring-specific second trench 56B including a part of the apex of the wiring-specific first embedded portion 46B.

The seal ring-specific second barrier metal 65A has a bent portion 65Aa having a shape that follows the outline of the second protruding region 56Ac of the seal ring-specific third trench 56A.

A third embedded portion 66 made of copper or a copper alloy, for example, is provided on the second barrier metal 65, or in other words embedded in the seal ring-specific third trench 56A and wiring-specific second trench 56B covered by the second barrier metal 65.

The third embedded portion 66 is one of the essential elements of the second wiring layer 60. More specifically, the third embedded portion 66 includes a wiring-specific second embedded portion 66B constituting a plurality of wires included in the second wiring layer 60, and a seal ring-specific third embedded portion 66A.

The wiring-specific second embedded portion 66B is embedded in the wiring-specific second trench 56B. The seal ring-specific third embedded portion 66A is embedded in the seal ring-specific third trench 56A.

The top surfaces of the wiring-specific second embedded portion 66B and seal ring-specific third embedded portion 66A have a substantially identical height to the surface of the second cap film 63.

As shown in FIG. 3, the second ring portion 68 is constituted by the seal ring-specific third embedded portion 66A and the seal ring-specific second barrier metal 65A.

In this embodiment, a so-called dual Damascene method is employed such that the lower and upper trench portions 56Aa and 56Ab of the seal ring-specific third trench 56A are embedded integrally in a single process, and the lower via hole 56Ba and upper trench 56Bb of the wiring-specific second trench 56B are embedded integrally in a single process. However, the present invention is not limited in this regard. For example, a single Damascene method may be used, in which the seal ring-specific lower trench 56Aa and the seal ring-specific upper trench 56Ab are embedded in individual processes and then connected.

A fourth diffusion preventing film 72 having a similar constitution to the first diffusion preventing film 41 is provided on the second cap film 63, second barrier metal 65, and third embedded portion 66.

The fifth insulating film 74 is laminated onto the fourth diffusion preventing film 72. The fifth insulating film 74 is a low dielectric constant film, which is similar to the second insulating film 42.

A fifth diffusion preventing film 81 having a similar constitution to the first diffusion preventing film 41 is provided on the fifth insulating film 74.

The sixth insulating film 82 is laminated onto the fifth diffusion preventing film 81. The sixth insulating film 82 is a low dielectric constant film, which is similar to the second insulating film 42.

A third cap film 83 having a similar constitution to the first cap film 43 is provided on the sixth insulating film 82.

A third trench portion 76 is provided so as to penetrate the fourth diffusion preventing film 72, fifth insulating film 74, fifth diffusion preventing film 81, sixth insulating film 82, and third cap film 83.

The third trench portion 76 and its embedded portion, to be described below, have the same structure as the second trench portion 56 and third embedded portion 66, respectively. Hence, only the constitution thereof will be described.

The third trench portion 76 is provided in the peripheral region 14. In other words, the third trench portion 76 constitutes a part of the seal ring 16.

Similar to the second trench portion 56, the third trench portion 76 is formed in consideration of the Damascene method that is employed in the formation process of each wiring layer of the semiconductor device 10.

A seal ring-specific lower trench 76A extending to a part of the apex of the seal ring-specific third embedded portion 66A penetrates the fourth diffusion preventing film 72 and fifth insulating film 74. The seal ring-specific lower trench 76A is provided in the peripheral region 14.

A seal ring-specific upper trench 76B having a greater width than the lower trench 76A is provided so as to penetrate the fifth diffusion preventing film 81, sixth insulating film 82, and third cap film 83. The seal ring-specific upper trench 76B is provided in the peripheral region 14.

More specifically, the third trench portion 76 is formed such that the seal ring-specific lower trench 76A and the seal ring-specific upper trench 76B, which have the same shape except for the trench width, communicate with each other vertically.

As shown in FIG. 1B, the seal ring-specific upper trench 76B of the third trench portion 76 has a third protruding region 76Ba defining the outline of the main body 16a and the protruding portion 16b.

A third barrier metal 85 having a similar constitution to the first barrier metal 45 is provided on the inner surface of the third trench portion 76. More specifically, a seal ring-specific third barrier metal 85 is provided on the surface of the third trench portion 76 including a part of the apex of the seal ring-specific third embedded portion 66A.

The third barrier metal 85 has a bent portion 85A that follows the outline of the third protruding region 76Ba of the third trench portion 76.

A fourth embedded portion 86 made of copper or a copper alloy, for example, is provided on the third barrier metal 85, or in other words embedded in the third trench portion 76 covered by the third barrier metal 85.

The fourth embedded portion 86 is one of the essential elements of the third wiring layer 80.

The fourth embedded portion 86 is embedded in the third trench portion 76. The apex of the fourth embedded portion 86 has a substantially identical height to the surface of the third cap film 83.

As shown in FIG. 3, the third ring portion 88 is constituted by the fourth embedded portion 86 and the third barrier metal 85.

This semiconductor device 10 has a greatly increased contact area between the seal ring and the insulating film. Hence, stress generated during a CMP process, which is required in a Damascene process, for example, is dispersed over the increased contact area. As a result, peeling on the interface between the low dielectric constant film and the seal ring can be prevented effectively.

A method of manufacturing the semiconductor device 10 will now be described.

Figure 5A:
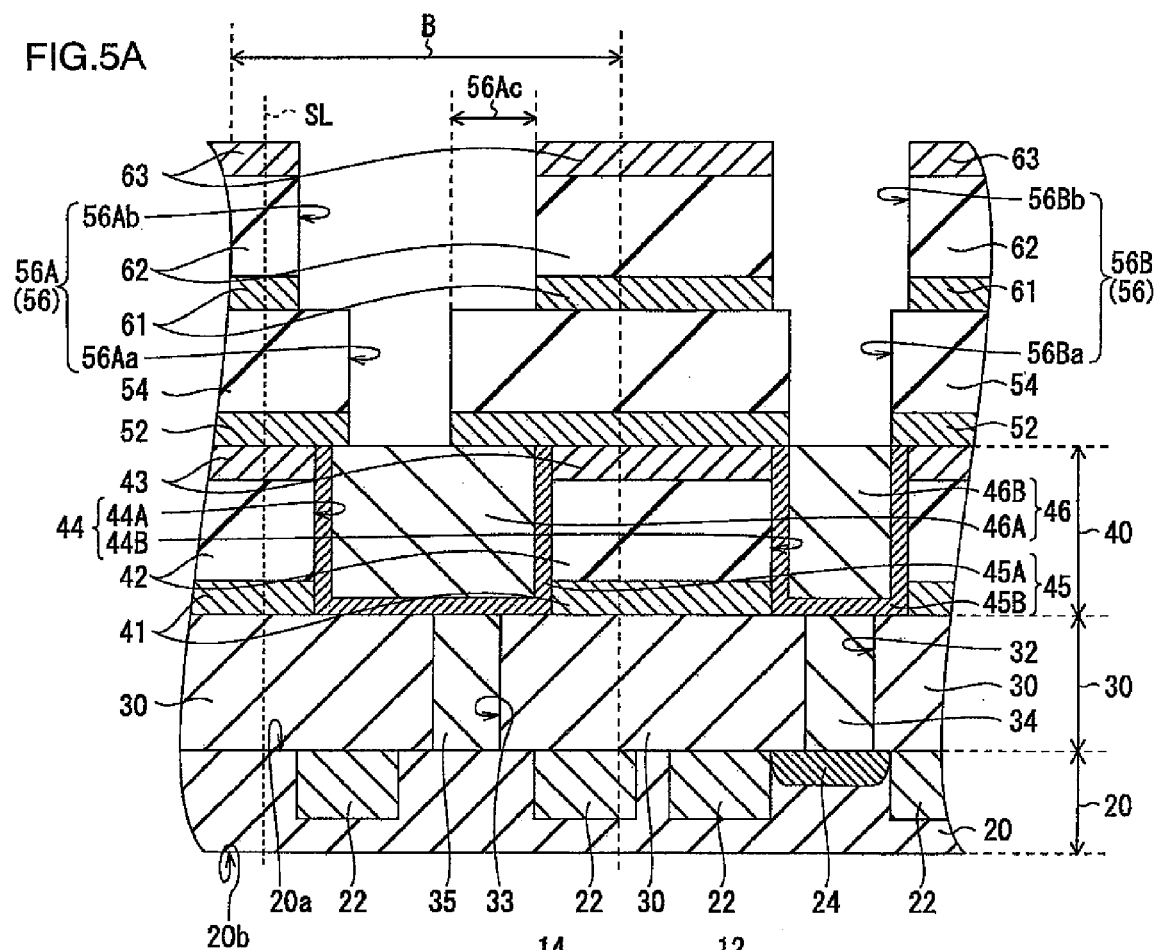
FIG. 5A is a cross-sectional view following on from FIG. 4B.
Figure 5B:
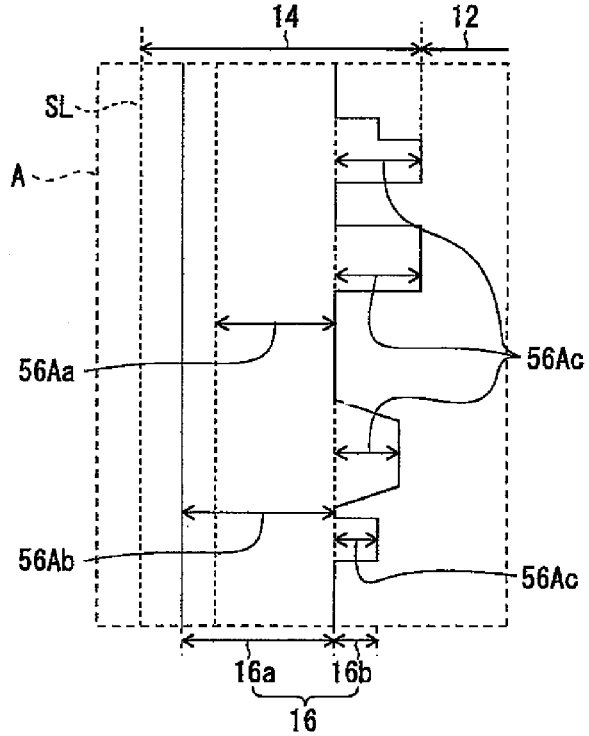
FIG. 5B is a plan view showing the form of a second protruding region.
Figure 6:
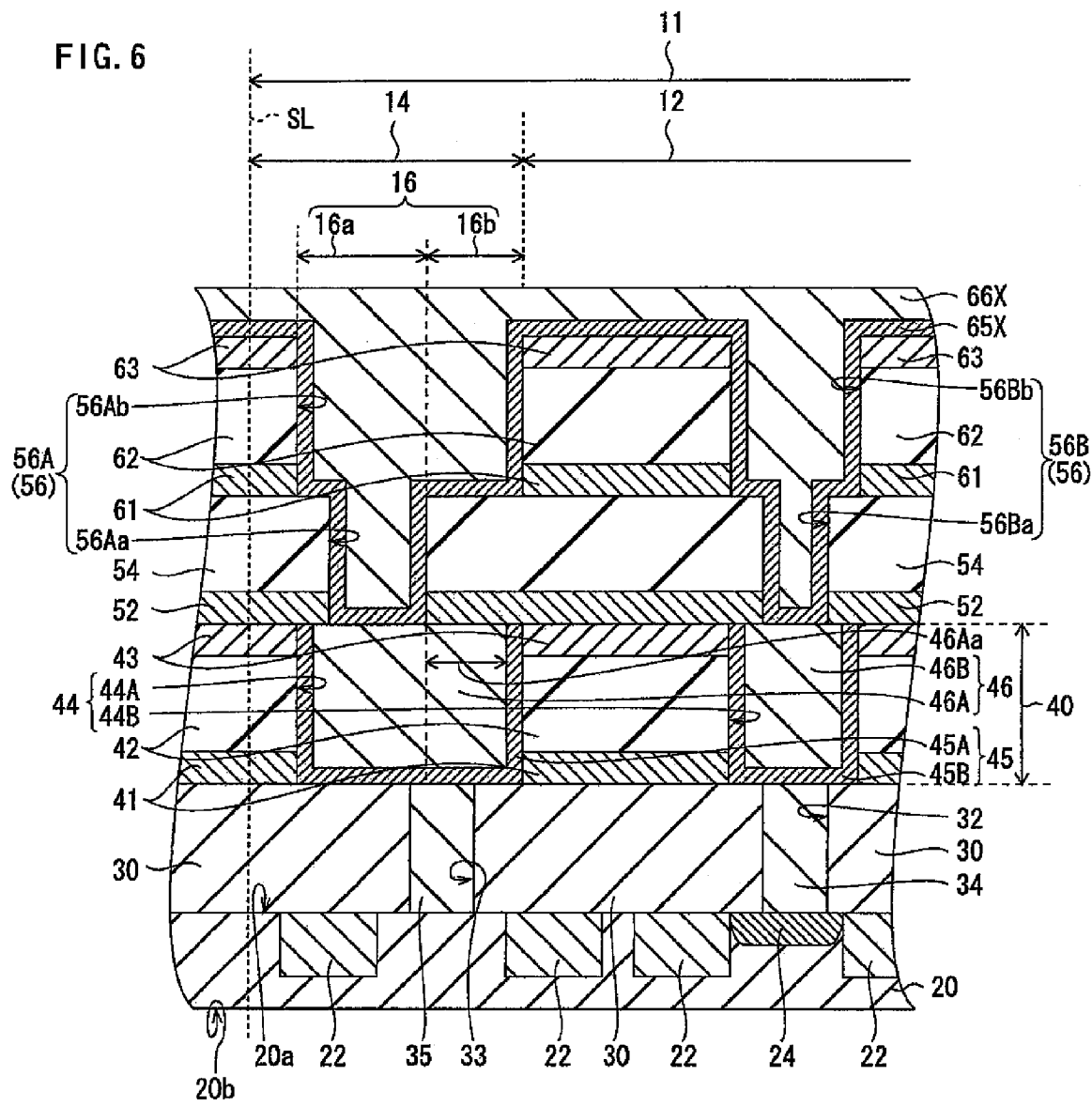
FIG. 6 is a cross sectional view following on from FIG. 5A.
Figure 7:
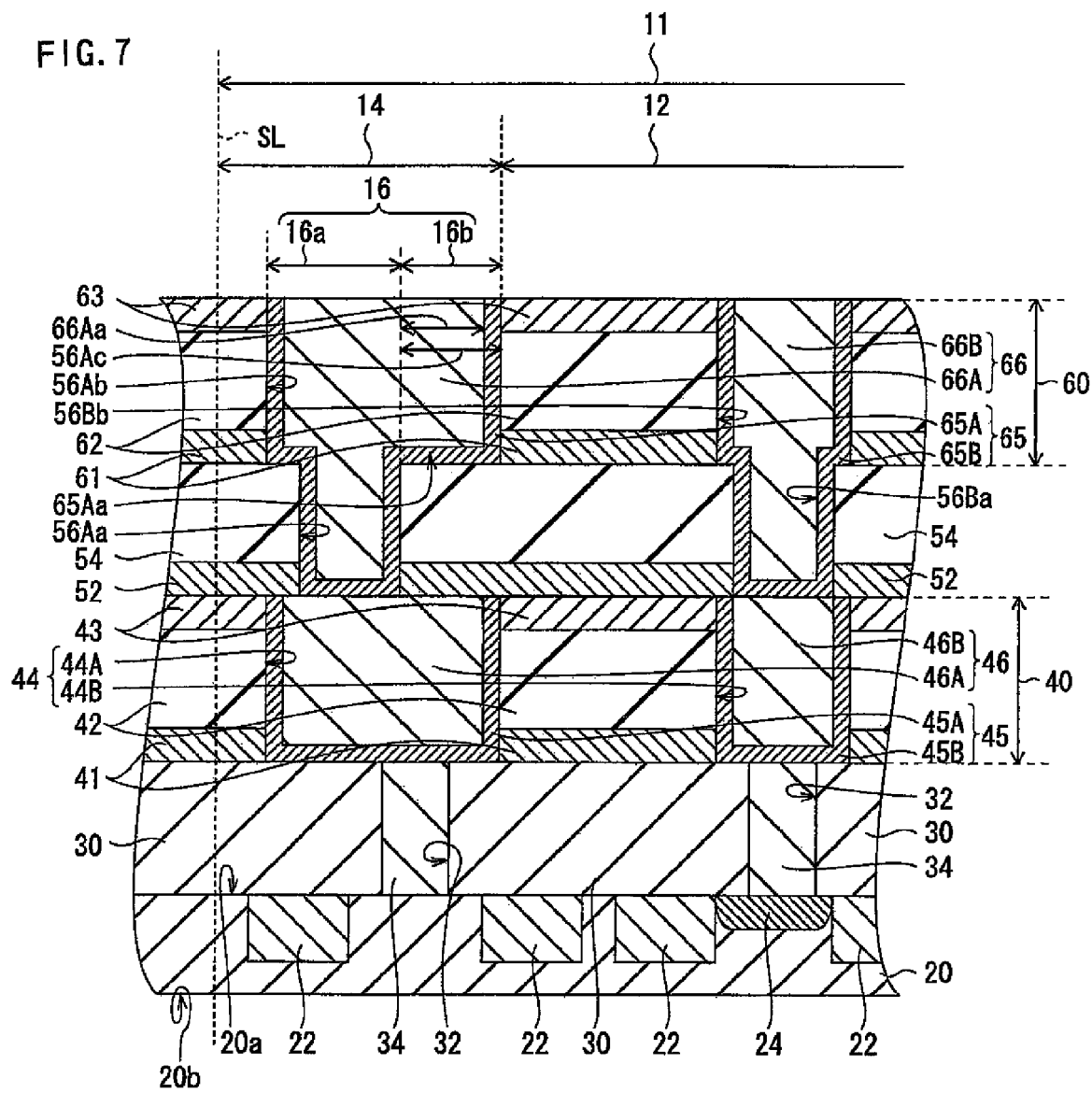
FIG. 7 is a cross sectional view following on from FIG. 6.

FIGS. 4A and 4B schematically show cut surfaces of a structure obtained during manufacture, cut along the line 2-2 in FIG. 1B. FIGS. 5A and 5B are diagrams following on from FIG. 4B. FIG. 6 is a diagram following on from FIG. 5A. FIG. 7 is a diagram following on from FIG. 6.

As shown in FIG. 4A, first, the substrate 20, which is preferably constituted by a silicon wafer, is prepared.

The chip area 11, which forms a semiconductor device when the substrate 20 is segmented by grinding the substrate 20 along the scribe lines SL, is set on the substrate 20. The electrically active element region 12 and the peripheral region 14 surrounding the element region 12 are defined in the chip region 11.

Next, the element separation structures 22 for electrically separating the elements are formed on the substrate 20 using a known method.

As already mentioned, STI (Shallow Trench Isolation) and LOCOS (Local Oxidation of Silicon) are examples of the element separation structures.

Next, a plurality of function elements such as transistors, which take the form of the diffusion layers 24, for example, are formed on the substrate 20. The element formation process may be implemented under suitable conditions by means of known ion implantation and diffusion processes.

The first insulating film 30 is then formed on the diffusion layers 24 and element separation structures 22.

As noted above, a silicon oxide film, for example, is used as the first insulating film 30. The first insulating film 30 may be formed using a conventional film deposition method such as a CVD method under suitable conditions.

Next, the contact hole 32 is formed within the element region 12 of the first insulating film 30 so as to penetrate the first insulating film 30 up to the function element (i.e., the diffusion layer 24). Simultaneously, the seal ring-specific first trench 33 is formed within the peripheral region 14 of the first insulating film 30 so as to penetrate the first insulating film 30 up to the substrate upper surface 20a and surround the element region 12 in an closed shape.

The contact hole 32 and seal ring-specific first trench 33 may be formed under suitable conditions by a series of processes including a resist application process, a process for forming a resist pattern through a photolithography process, and an etching process using the resist pattern as a mask.

Next, the contact 34 is embedded in the contact hole 32 is by a known method. At the same time, the seal ring-specific first trench 33 is filled with a known conductive material such as tungsten to form the seal ring-specific first embedded portion 35.

The embedded contact 34 and seal ring-specific first embedded portion 35 may be made from a known conductive material such as tungsten (W).

In order to form the embedded contact 34 and the seal ring-specific first embedded portion 35, preferably the contact hole 32 and the seal ring-specific first trench 33 are simultaneously filled in accordance with a known method such as a sputtering method. Then, the embedded contact 34 and the seal ring-specific first embedded portion 35 are formed by an etch-back process. By means of the etching back process, the top surfaces of the embedded contact 34 and seal ring-specific first embedded portion 35 become substantially coplanar to the surface of the first insulating film 30.

Next, the first diffusion preventing film 41 is formed on the first insulating film 30 and the embedded contact 34 and seal ring-specific first embedded portion 35 exposed from the first insulating film 30.

The first diffusion preventing film 41 may be formed by depositing a silicon nitride film or a silicon carbide (SiC) film, for example, using a known CVD method or the like under suitable conditions.

The second insulating film 42 is then laminated onto the first diffusion preventing film 41.

As described above, the second insulating film 42 is preferably a known low dielectric constant film (Low-k film) having a dielectric constant (k) of 3.0 or less, which is deposited using a material such as HSQ (hydrogen silsesquioxane), MSQ (methyl silsesquioxane), or CDO (carbon doped oxide), or a polymer material such as SiLK (registered trademark), manufactured by The Dow Chemical Company, for example.

The second insulating film 42 is deposited by a process that suits for the selected film material, such as a known coating method or CVD method.

Next, the first cap film 43 is laminated onto the surface of the second insulating film 42. A high-density silicon oxide film, for example, is preferably used as the cap film.

Specifically, the first cap film 43 is preferably formed by depositing high-density silicon oxide using a known plasma CVD method under suitable conditions.

Next, the first trench portion 44 is formed. The first trench portion 44 (more specifically the seal ring-specific second trench 44A having the first protruding region 44Aa and the wiring-specific first trench 44B) is formed so as to penetrate the first cap film 43, second insulating film 42, and first diffusion preventing film 41 from the surface of the first cap film 43 to the surface of the first insulating film 30.

The first trench portion 44 may be formed into a desired pattern through a known photolithography process, and by patterning the first cap film 43, second insulating film 42, and first diffusion preventing film 41 in an etching process suited for the material constituting each film, performed under suitable conditions.

Next, the first barrier metal 45 is formed to cover the inner surface of the first trench portion 44.

First, a first barrier metal film 45X is deposited so as to cover all of the exposed surfaces, i.e., the surface of the first cap film 43, the side wall of the first trench portion 44, the exposed surface of the first insulating film 30, the exposed apex of the embedded contact 34, and the exposed apex of the seal ring-specific first embedded portion 35.

The first barrier metal film 45X may be a single layer film or a multi-layer film, and is preferably formed by depositing a known material selected from a group including tantalum, tantalum nitride, tungsten, tungsten nitride, WSiN, titanium nitride, and TiSiN, for example, using a method suitable for the selected material.

The first barrier metal film 45X is preferably formed at an optimum film thickness value in accordance with the so-called technology node. This film thickness is within a range of 2 nm to 50 nm, for example.

Next, a first wiring film 46X is deposited on the first barrier metal film 45X by embedding a copper alloy, for example, in the first trench portion 44 covered by the first barrier metal film 45X so as to cover all of the exposed surfaces.

The process for forming the copper-alloy first wiring film 46X is preferably performed in two stages. Specifically, in a first stage, a copper alloy film is deposited on all of the exposed surfaces using a known PVD method, preferably within a film thickness range of 20 nm to 150 nm. Next, in a second stage, the first wiring layer 46X is formed so as to fill the first trench portion 44, preferably using a known electroplating method, CVD method, or electroless plating method.

Next, as shown in FIG. 4B, the first barrier metal film 45X and first wiring film 46X are ground flat until the surface of the first cap film 43 is exposed, or in other words such that the apexes of the wiring-specific first embedded portion 46B and the seal ring-specific second embedded portion 46A are substantially the same height as the surface of the first cap film 43. In this grinding process, the seal ring-specific first barrier metal 45A, which covers the first trench portion 44 (i.e., the inner surface of the seal ring-specific second trench 44A) and has the bent portion 45Aa (see FIG. 1B) shaped in accordance with the outline of the first protruding region 44Aa of the seal ring-specific second trench 44A is completed. Also, the wiring-specific first barrier metal 45B covering the inner surface of the wiring-specific first trench 44B, the wiring-specific first embedded portion 46B constituting the wires included in the first wiring layer 40, and the seal ring-specific second embedded portion 46A having the first protruding portion 46Aa are completed. In other words, the first ring portion 48 having the first barrier metal 45A and second embedded portion 46A is formed (see FIG. 3).

The grinding process preferably employs a known CMP process performed under suitable conditions. The suitable conditions are, for example, as follows: the polishing pressure is within a range of approximately 2.5 psi to 4.5 psi, and the relative velocity between the polishing pad and the polishing surface is within a range of approximately 60 m/min to 180 m/min.

The seal ring-specific first barrier metal 45A has the bent portion 45Aa. Hence, the contact area with the insulating film can be increased by an amount corresponding to the bent portion. Accordingly, stress generated in the CMP process is dispersed over the increased contact area, and therefore peeling on the interface between the low dielectric constant film and the other structures can be prevented effectively.

As shown in FIG. 4B, next, the second diffusion preventing film 52 is formed on the exposed first cap film 43, first barrier metal 45, and second embedded portion 46 by implementing a similar process to that used to form the first diffusion preventing film 41.

The third insulating film 54, which is a low dielectric constant film, is laminated onto the second diffusion preventing film 52 by implementing a similar process to that used to form the second insulating film 42.

The third diffusion preventing film 61 is laminated onto the third insulating film 54 by implementing a similar process to that of the first diffusion preventing film 41.

The fourth insulating film 62, which is a low dielectric constant film, is laminated onto the third diffusion preventing film 61 by implementing a similar process to that used to form the second insulating film 42.

The second cap film 63 is formed on the fourth insulating film 62 by implementing a similar process to that used to form the first cap film 43.

The second trench portion 56 is formed so as to penetrate the second diffusion preventing film 52, third insulating film 54, third diffusion preventing film 61, fourth insulating film 62, and second cap film 63.

The second trench portion 56 may be formed in a desired pattern by patterning each film using a known photolithography process and an etching process performed under suitable conditions decided based on the materials constituting each laminated film.

To form the second trench portion 56, first, a seal ring-specific precursory third trench 56AX and a wiring-specific precursory second trench 56BX are formed.

The seal ring-specific precursory third trench 56AX is formed in the peripheral region 14. By forming the seal ring-specific precursory third trench 56AX, a part of the apex of the seal ring-specific second embedded portion 46A is exposed through the second diffusion preventing film 52, third insulating film 54, third diffusion preventing film 61, fourth insulating film 62, and second cap film 63.

The wiring-specific precursory second trench 56BX is formed in the element region 12 so as to penetrate the second diffusion preventing film 52, third insulating film 54, third diffusion preventing film 61, fourth insulating film 62, and second cap film 63 and expose a part of the apex of the wiring-specific first embedded portion 46B. In this embodiment, the wiring-specific precursory second trench 56BX is a penetrating hole.

As shown in FIG. 5A, in a region including the seal ring-specific precursory third trench 56AX and wiring-specific precursory second trench 56BX, the wider seal ring-specific upper trench 56Ab and the wiring-specific upper trench 56Bb are formed from the surface of the second cap film 63 to the surface of the third insulating film 54 so as to penetrate the second cap film 63, fourth insulating film 62, and third diffusion preventing film 61. The wiring-specific upper trench 56Bb is wider than the diameter of the wiring-specific precursory second trench (i.e., penetrating hole) 56BX.

As a result of this process, the remaining precursory third trench 56AX penetrating the second diffusion preventing film 52 and third insulating film 54 becomes the seal ring-specific lower trench 56Aa communicating with the seal ring-specific upper trench 56Ab, and the remaining precursory second trench 56BX becomes the wiring-specific lower via hole 56Ba communicating with the wiring-specific upper trench 56Bb.

By means of the processes up to this point, the seal ring-specific precursory third trench 56AX and wiring-specific precursory second trench 56BX become the second trench portion 56 including the seal ring-specific third trench 56A and the wiring-specific second trench 56B. The seal ring-specific third trench 56A vertically connects the seal ring-specific lower trench 56Aa and seal ring-specific upper trench 56Ab, which have the same shape except for trench width. The wiring-specific second trench 56B connects the wiring-specific lower via hole 56Ba and the wiring-specific upper trench 56Bb.

As shown in FIGS. 5A and 5B, the seal ring-specific upper trench 56Ab is formed with the second protruding region 56Ac that defines the contour of the protruding portion 16b.

The overall width of the seal ring 16 may take any value within a range of approximately 2 μm to 20 μm.

The second protruding region 56Ac is formed in an arbitrary size and an arbitrary shape within the allowable range decided by an optical system of an exposure device used in the photolithography process. In the illustrated embodiment, the protruding portion 16b is a combination of a plurality of shapes such as an irregular square shape, a rectangular shape, a trapezoid shape, and another rectangular shape of a different size.

The disposal interval between the second protruding regions 56Ac, or in other words the separation distance therebetween, may be set to an arbitrary preferred value within the allowable range of the optical system of the exposure device used in the photolithography process.

The minimum size of the second protruding region 56Ac may be an approximately half the minimum pitch. According to typical technological standards, this equates to approximately 200 nm in the case of a 65 nm node, for example. In the case of a 45 nm node, the minimum size is approximately 130 nm. In the case of a 32 nm node, the minimum size is approximately 90 nm.

As shown in FIG. 6, a second barrier metal film 65X is formed to cover all of the exposed surfaces, or in other words the surface of the second cap film 63 and the inner surface of the second trench portion 56. The second barrier metal film 65X may be formed by implementing a similar process to that used to form the first barrier metal film 45X.

A second wiring film 66X is deposited on the second barrier metal film 65X by embedding a copper alloy, for example, in the second trench portion 56 covered by the second barrier metal film 65X so as to cover all of the exposed surfaces.

The second wiring film 66X may be formed by implementing a similar process to that used to form the first wiring film 46X.

As illustrated in FIG. 7, the second barrier metal film 65X and second wiring film 66X are ground flat until the surface of the second cap film 63 is exposed, or in other words such that the apexes of the wiring-specific third embedded portion 66B and the seal ring-specific third embedded portion 66A are substantially the same height as the surface of the second cap film 63. In this grinding process, the seal ring-specific second barrier metal 65A, which covers the second trench portion 56 (i.e., the inner surface of the seal ring-specific third trench 56A) and has the bent portion 65Aa shaped in accordance with the outline of the second protruding region 56Ac of the seal ring-specific third trench 56A is completed. Also, the wiring-specific second barrier metal 65B covering the inner surface of the wiring-specific second trench 56B, the wiring-specific third embedded portion 66B constituting the wires included in the second wiring layer 60, and the seal ring-specific third embedded portion 66A having the second protruding portion 66Aa are completed. In other words, the second ring portion 68 having the seal ring-specific second barrier metal 65A and the seal ring-specific third embedded portion 66A is obtained (see FIG. 3).

The grinding process is preferably performed using a known CMP process performed under suitable conditions, similar to the manufacturing process of the first barrier metal 45.

The seal ring-specific second barrier metal 65A has the bent portion 65Aa. Hence, the contact area with the insulating film can be increased by an amount corresponding to the bent portion 65Aa. Accordingly, stress generated in the CMP process is dispersed over the increased contact area, and therefore peeling on the interface between the low dielectric constant film and the other structures can be prevented effectively.

When a further wiring layer is to be formed, a third wiring layer 80 (see FIG. 2) including wiring and a seal ring having an arbitrary preferred pattern and/or a fourth wiring layer may be laminated onto the upper side of the second wiring layer 60 by repeating a similar process to the manufacturing process of the second wiring layer 60.

Once all of the wiring layers are formed, a segmentation process is performed by grinding with a known dicing blade or the like along the scribe lines SL. As a result, the semiconductor device 10 is cut out.

Second Embodiment

Figure 8A:
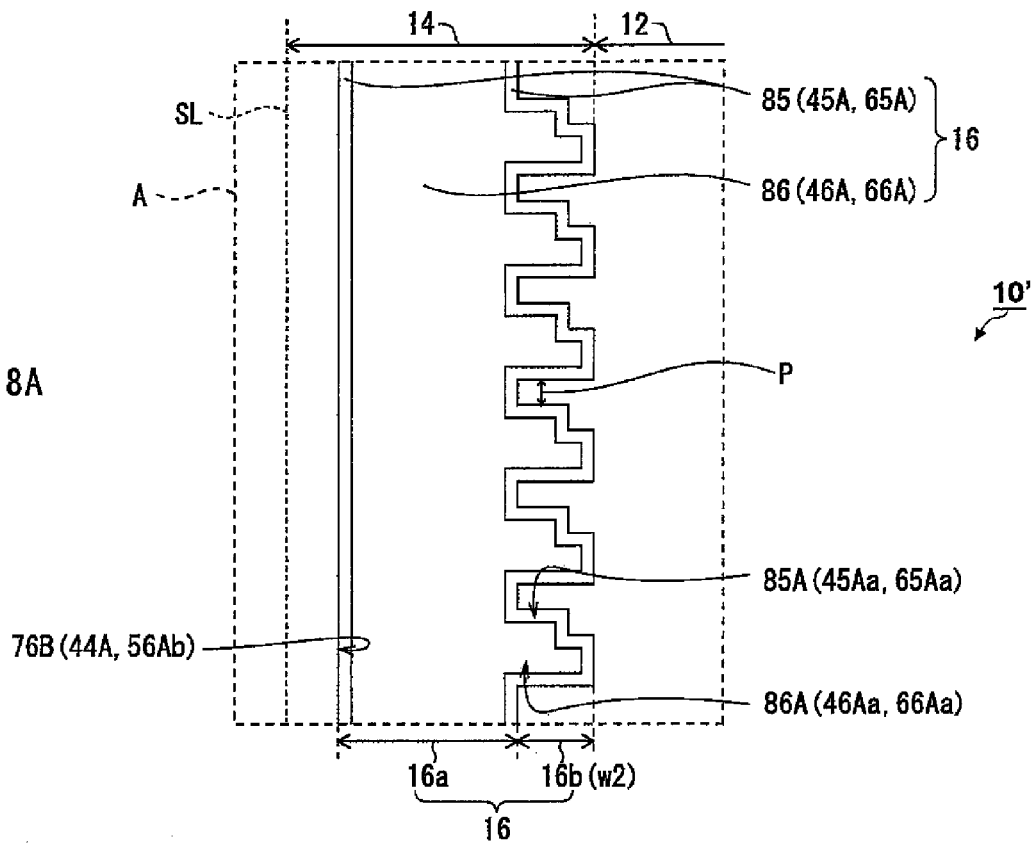
FIG. 8A is similar to FIG. 1B and shows a partial plan view of a single semiconductor device according to a second embodiment of the present invention.

Referring to FIG. 8A, a second embodiment of the semiconductor device 10' according to the present invention will be described.

The characterizing features of the semiconductor device 10' are the shape and arrangement of the seal ring protruding portions. It should be noted that in the second embodiment, all constitutional elements and manufacturing methods other than those of the seal ring are identical to their counterparts in the first embodiment, and hence detailed description thereof are omitted.

FIG. 8A is a partial plan view of a single semiconductor device 10' immediately before segmentation, seen from an upper surface side. FIG. 8A is an enlarged view of the region A shown in FIG. 1A.

As shown in FIG. 8A, the seal ring 16 of this embodiment has a plurality of protruding portions 16b.

In the second embodiment, the protruding portions 16b all have an irregular square shape, when viewed from top. The irregular square shape is a shape from which one of the two corners protruding onto the element region 12 side has been cut away. The protruding portions 16b are arranged parallel to the extending direction of the seal ring 16, i.e., a direction from the peripheral region 14 toward the element region 12, which is orthogonal to the extending direction of the seal ring 16.

The protruding portions 16b all have the same shape and size (protrusion length w2), and are spaced from each other at equal intervals P.

The minimum value of the separation distance P is decided in accordance with the resolution limit of the photolithography process in particular. The minimum separation distance P is, for example, the minimum pitch decided by the resolution limit of the optical system of the exposure device.

With this constitution, the stress applied to the seal ring 16 in the CMP process spreads more even. As a result, local stress concentration during the CMP process can be prevented, and therefore peeling on the interface between the seal ring 16 and the insulating film that contacts the seal ring 16, in particular the interface between the seal ring and the low dielectric constant film, can be prevented more effectively.

Third Embodiment

Figure 8B:
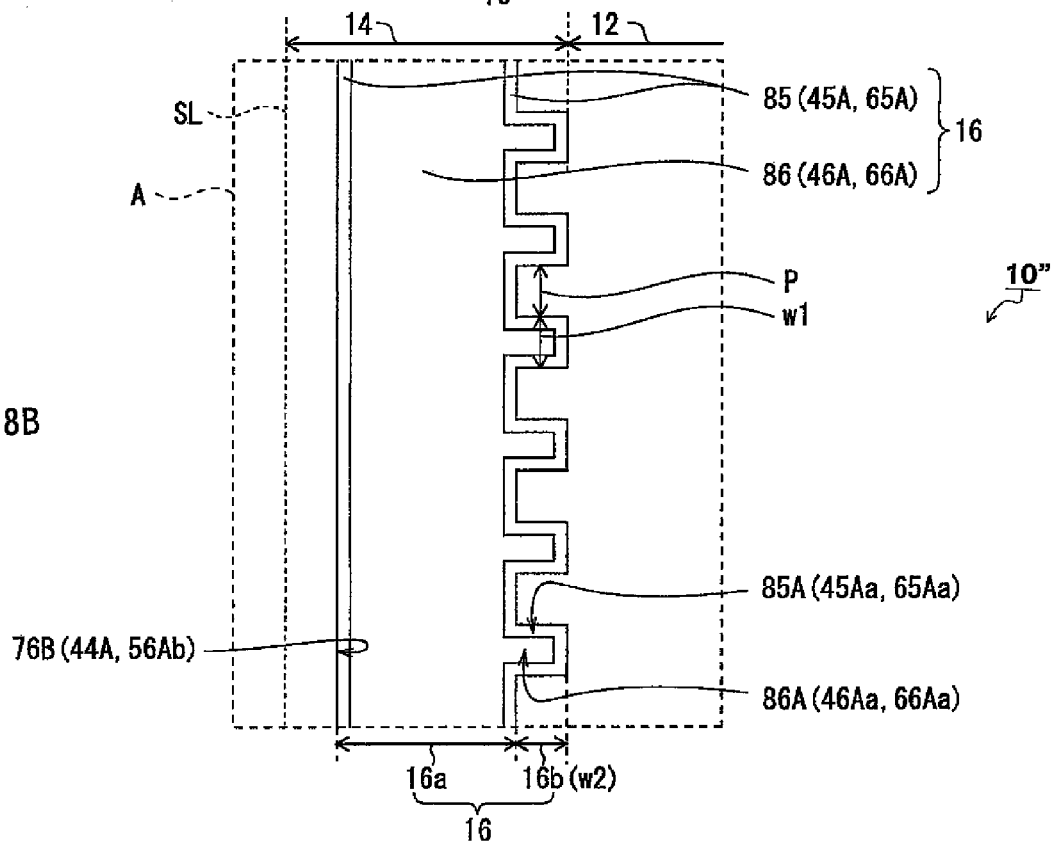
FIG. 8B is also similar to FIG. 1B and shows a partial plan view of a single semiconductor device according to a third embodiment of the present invention.

Referring to FIG. 8B, a third embodiment of the semiconductor device according to the present invention will be described.

FIG. 8B is similar to FIG. 8A. Specifically, FIG. 8B is a partial plan view of a single semiconductor device 10" immediately before segmentation. In other words, FIG. 8B is similar to FIG. 1B.

As shown in FIG. 8B, the seal ring 16 of this embodiment has a plurality of protruding portions 16b.

The protruding portions 16b all take a square shape when viewed from top. The protruding portions 16b are arranged in comb-tooth form in parallel to the extending direction of the seal ring 16, i.e., a direction from the peripheral region 14 toward the element region 12, which is orthogonal to the extending direction of the seal ring 16.

The protruding portions 16b in this embodiment all have the same shape and size (protrusion length w2, protrusion width w1), and are spaced from each other at equal intervals P.

The separation distance P and the protrusion length w2 are set at minimum values (the minimum pitch) allowed by the resolution limit of the manufacturing process, in particular the photolithography process.

With this constitution, the third embodiment can exhibit not only the same advantages as the first and second embodiments, but also additional advantages, i.e., the size of the peripheral region 14 of the semiconductor device 10" can be minimized. The peripheral region 14 is the region that does not contribute to the electrical function of the semiconductor device 10". Thus, the planar surface area of the semiconductor device 10" can be reduced without affecting the function of the semiconductor device 10". As a result, manufacturing costs can be lowered.

In the above-described embodiments, the protruding portions 16b of the seal ring 16 are only provided in the element region 12, and the scribe line SL side thereof is planar. However, a similar shape to the protruding portions 16b may also be provided on the scribe line SL side. With such structure, peeling between the seal ring and the insulating film during the segmentation process can be prevented effectively.

This application is based on Japanese Patent Application No. 2006-352801 filed on Dec. 27, 2006 and the entire disclosure thereof is incorporated herein by reference.

What is claimed is:

1. A semiconductor device comprising:
   at least one function element;
   a substrate, on which an element region and a peripheral region are defined such that all of the at least one function element is provided in the element region, and the peripheral region surrounds said element region;
   a first wiring layer which includes wiring provided in said element region; and
   a first seal ring including a ring portion that is provided in said peripheral region in a same layer as the first wiring layer, said ring portion having a main body surrounding said element region, and also having a plurality of protruding portions protruding toward said element region from said main body, said plurality of protruding portions only extending in said peripheral region and at least one of said plurality of protruding portions having a step portion.

2. The semiconductor device according to claim 1, wherein all of said plurality of protruding portions have a step portion of identical shape and identical size, said plurality of protruding portions extend parallel to an extending direction of said seal ring main body, and said plurality of protruding portions are spaced from each other at equal intervals.

3. The semiconductor device according to claim 1, wherein a minimum distance between adjacent said protruding portions is decided by a resolution limit of an optical system in an employed exposure device.

4. The semiconductor device according to claim 2, wherein said plurality of protruding portions all have a minimum size defined by a resolution limit of an optical system in an employed exposure device.

5. The semiconductor device according to claim 1, further comprising at least another wiring layer, and a first interlayer insulating film provided between said first wiring layer and said another wiring layer, and also comprising at least another seal ring provided in said at least another wiring layer respectively such that the semiconductor device has a multi-layer wiring structure, wherein the ring portion in said first wiring layer is connected to a ring portion of said another seal ring by a first embedded portion penetrating said first interlayer insulating film.

6. The semiconductor device according to claim 5, wherein said ring portion of said another seal ring is formed integrally with said first embedded portion.

7. The semiconductor device according to claim 5, wherein said first interlayer insulating film is made from an insulating material having a specific dielectric constant of 3.0 or less.

8. The semiconductor device according to claim 7, wherein said insulating material is selected from a group including a polymer material and a porous material containing silicon dioxide hydrogen silsesquioxane, methyl silsesquioxane, SiOC, and an organic component.

9. The semiconductor device according to claim 7, wherein a thickness of said first interlayer insulating film is within a range of 100 nm to 5000 nm.

10. The semiconductor device according to claim 5, further comprising a barrier metal which covers a side of said ring portion of said another seal ring and a side of said first embedded portion.

11. The semiconductor device according to claim 10, wherein said barrier metal is a single layer film or a multilayer film and is made from a material selected from a group of metals including tantalum, tantalum nitride, tungsten, tungsten nitride, WSiN, titanium nitride, and TiSiN.

12. The semiconductor device according to claim 10, wherein a thickness of said barrier metal is within a range of 2 nm to 50 nm.

13. The semiconductor device according to claim 1, wherein the element region has a square shape.

14. The semiconductor device according to claim 1, wherein some of said protruding portions have a trapezoid shape.

15. A semiconductor device comprising:
a substrate, on which an element region and a peripheral region are defined such that all function elements are in the element region, and the peripheral region surrounds said element region;
an insulating film provided on an upper surface of said substrate;
a seal ring-specific trench that penetrates said insulating film;
a wiring-specific trench that penetrates said insulating film;
a first wiring layer provided in said element region so as to be embedded in said wiring-specific trench, said first wiring layer having wiring made from copper; and
a first seal ring including a ring portion provided in said peripheral region so as to be embedded in the seal ring-specific trench,
wherein said ring portion is provided in a same layer as said first wiring layer, and has a main body surrounding said element region, and a plurality of protruding portions protruding toward said element region from said seal ring main body, said plurality of protruding portions only extending in said peripheral region and at least one of said plurality of protruding portions having a step portion.

16. The semiconductor device according to claim 15, wherein all of said plurality of protruding portions have a step portion of identical shape and identical size, said plurality of protruding portions extend parallel to an extending direction of said seal ring main body, and said plurality of protruding portions are spaced from each other at equal intervals.

17. A semiconductor device comprising:
at least one function element;
a substrate, on which an element region and a peripheral region are defined such that all of the at least one function element is provided in the element region and the peripheral region surrounds said element region;
a first wiring layer which includes wiring provided in said element region; and
a first seal ring including a ring portion provided in said peripheral region in a same layer as the first wiring layer, said ring portion having a main body surrounding said element region, and also having a plurality of protruding portions protruding toward said element region from said main body, all of said plurality of protruding portions having free ends in the peripheral region and at least one of said plurality of protruding portions having a step portion.

18. The semiconductor device according to claim 17, wherein all of said plurality of protruding portions have a step portion of identical shape and identical size, said plurality of protruding portions extend parallel to an extending direction of said seal ring main body, and said plurality of protruding portions are spaced from each other at equal intervals.

* * * * *